United States Patent
Zhan (10) Patent No.: US 8,653,564 B1
(45) Date of Patent: Feb. 18, 2014

(54) MILLIMETER-WAVE TRANSISTOR DEVICE

(75) Inventor: Jing-Hong Conan Zhan, HsinChu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 796 days.

(21) Appl. No.: 12/551,581

(22) Filed: Sep. 1, 2009

(51) Int. Cl.
*H01L 29/76* (2006.01)

(52) U.S. Cl.
USPC .......................................... 257/213; 257/249

(58) Field of Classification Search
USPC ........................................................ 257/213
See application file for complete search history.

(56) References Cited

U.S. PATENT DOCUMENTS

| 8,203,185 B2 * | 6/2012 | Sriram | 257/369 |
| 2006/0098469 A1 * | 5/2006 | Yang et al. | 365/63 |

OTHER PUBLICATIONS

Leonid Belostotski and James W. Haslett, IEEE Journal of Solid-State Circuits, vol. 42, No. 11, Nov. 2007.
Babak Heydari, Mounir Bohsali, Ehsan Adabi and Ali M. Niknejad, IEEE Journal of Solid-State Circuits, vol. 42, No. 12, Dec. 2007.

* cited by examiner

*Primary Examiner* — Samuel Gebremariam
(74) *Attorney, Agent, or Firm* — Winston Hsu; Scott Margo (57) ABSTRACT

A millimeter-wave transistor device includes a plurality of sub-cells arranged in matrix array, each of the sub-cells having a longitudinal gate finger elongating along a reference y-axis, a source doping region disposed at one side of the longitudinal gate finger and a drain doping region at the other side of the longitudinal gate finger opposite to the source doping region; and at least three parallel connecting bars extending along a reference x-axis, electrically connecting with respective distal ends of the longitudinal gate finger of each of the sub-cells.

24 Claims, 10 Drawing Sheets

| Layout type | Final layout dimension ($\mu m * \mu m$) | Overall aspect ratio | Rg (Ohm) |
|---|---|---|---|
| 1 row | 4.62 * 1.5 | 3.08 | 29.8 |
| 2 rows | 2.53 * 3.06 | 0.82 | 1.3 |
| 4 rows | 1.48 * 5.85 | 0.25 | 2.1 |

FIG. 8

MILLIMETER-WAVE TRANSISTOR DEVICE

BACKGROUND OF THE INVENTION

1. Field of the Invention

The present invention relates generally to the field of semiconductor devices. More particularly, the present invention relates to RF/millimeter-wave (mmW) transistor device structure and layout thereof.

2. Description of the Prior Art

The rapid scaling of CMOS to shorter channel lengths has enabled circuits to operate well into the millimeter-wave frequency range. While CMOS is not an obvious technology for millimeter-wave applications in terms of raw performance, especially compared to SiGe and III-V technologies, it has clear advantages including low cost and potential for integration with other parts of the system which makes it a natural candidate for exploration.

It has been known that the device layout impacts on the device performance in mm-wave frequencies. Unlike low-frequency circuit design in which the device design is absolutely in the realm of process engineers, the device performance may be altered drastically by changing the device layout. This enables the circuit designers to layout the device based on the performance metric appropriate to a specific application. For instance, $f_{max}$, which is an indicator of the speed of the transistor, has been reported to vary from 80 GHz to up to 280 GHz for an identical CMOS 90 nm process, mainly due to differences in the layout. It also has been known that the gate-to-drain capacitance ($C_{gd}$) and the gate resistance ($R_g$) have the largest impact on $f_{max}$.

For example, some common performance metrics for mm-wave devices include $f_{max}$, transit frequency ($f_T$), maximum stable gain (MSG), maximum unilateral gain (U), output power, drain efficiency, and minimum noise factor $F_{min}$. The selection of the appropriate metric as an optimization target depends on the specific application of the device. It has been found that the source resistance changes the MSG since it changes the effective transconductance through its local feedback effect. Generally, lower source resistance ($R_s$) results in lower noise for low-noise amplifier (LNA), higher power gain for both LNA and power amplifier (PA), and higher efficiency for PA. Lower $R_g$ results in lower noise for LNA, while lower drain resistance $R_d$ results in higher efficiency for PA.

"Millimeter-Wave Devices and Circuit Blocks up to 104 GHz in 90 nm CMOS", IEEE journal of Solid-State Circuits, Vol. 42, No. 12, December 2007, Pages 2893-2903, by B. Heydari, M. Bohsali, E. Adabi, and A. M. Niknejad, discloses a multi-finger layout of a 80*1 µm/90 nm NMOS device and claims that such device layout increases the $f_{max}$ up to 20% and renders the MSG unchanged. However, the aforesaid device layout has drawbacks including high $R_g$ due to single side gate contacts, large gate-to-bulk or drain-to-bulk capacitance that in turn lowers $f_T$ and $f_{max}$, and large distributed $R_d$, $R_s$ and $R_g$ due to long metal traces.

The above-mentioned reference also discloses a round-table NMOS device comprising a plurality of sub-cells arranged in a circularly connecting (round-table) configuration. However, the round-table device has drawbacks including large overall aspect ratio and large distributed $R_d$, $R_s$ and $R_g$ due to long metal traces. Besides, the round-table device requires rotation of the sub-cells leading to different direction of the gate fingers, which is difficult to practice in the advanced process.

SUMMARY OF THE INVENTION

It is one objective of this invention to provide an improved mmW transistor device with higher gain, higher $f_T$ and $f_{max}$, and/or lower $f_{min}$ compared to the prior art.

It is another objective of this invention to provide a transistor device layout which has a minimum overall aspect ratio.

It is another objective of this invention to provide a transistor device layout which minimizes parasitic resistance.

It is still another objective of this invention to provide a transistor device layout which minimizes parasitic inductance.

It is still another objective of this invention to provide a transistor device layout which minimizes wave discontinuity.

According to the claimed invention, a millimeter-wave transistor device includes a plurality of sub-cells arranged in matrix array, each of the sub-cells comprising a longitudinal gate finger elongating along a reference y-axis, a source doping region disposed at one side of the longitudinal gate finger and a drain doping region at the other side of the longitudinal gate finger opposite to the source doping region; and at least three parallel connecting bars extending along a reference x-axis, electrically connecting with respective distal ends of the longitudinal gate finger of each of the sub-cells.

In one aspect, a transistor device having drain, gate and source, characterized in that: at least one of the drain, gate and source comprising N fingers, wherein the fingers of the at least one of the drain, gate and source are connected to form an improved layout such that a layout resistance of the improved layout is less than a layout resistance of a prototypal layout in which the fingers are arranged in a single row.

Both device sizes of the prototypal layout and the improved layout are N*W/L, where W is a width of each of the fingers, and L is a length of each of the fingers.

In another aspect, a transistor device having drain, gate and source, characterized in that: at least one of the drain, gate and source comprising N fingers, wherein the fingers of the at least one of the drain, gate and source are connected to form an improved layout such that a layout inductance of the improved layout is less than a layout inductance of a prototypal layout in which the fingers are arranged in a single row.

In still another aspect, a transistor device having drain, gate and source, characterized in that: at least one of the drain, gate and source comprising N fingers, wherein the fingers of the at least one of the drain, gate and source are connected to form an improved layout such that a wave reflection of the improved layout is less than a wave reflection of a prototypal layout in which the fingers are arranged in a single row.

These and other objectives of the present invention will no doubt become obvious to those of ordinary skill in the art after reading the following detailed description of the preferred embodiment that is illustrated in the various figures and drawings.

DETAILED DESCRIPTION

As previously mentioned, the device layout has a significant impact on performance at mm-wave frequencies. As a result, careful device design becomes quite important in pushing the capability of CMOS to higher frequencies. The invention provides an improved mmW transistor device structure and layout with higher gain, higher $f_T$ and $f_{max}$ and lower $f_{min}$ compared to the prior art. This invention is particularly suited for RF communication applications such as power amplifiers or low-noise amplifiers associated with millimeter-wave communication transceivers.

Figure 1:
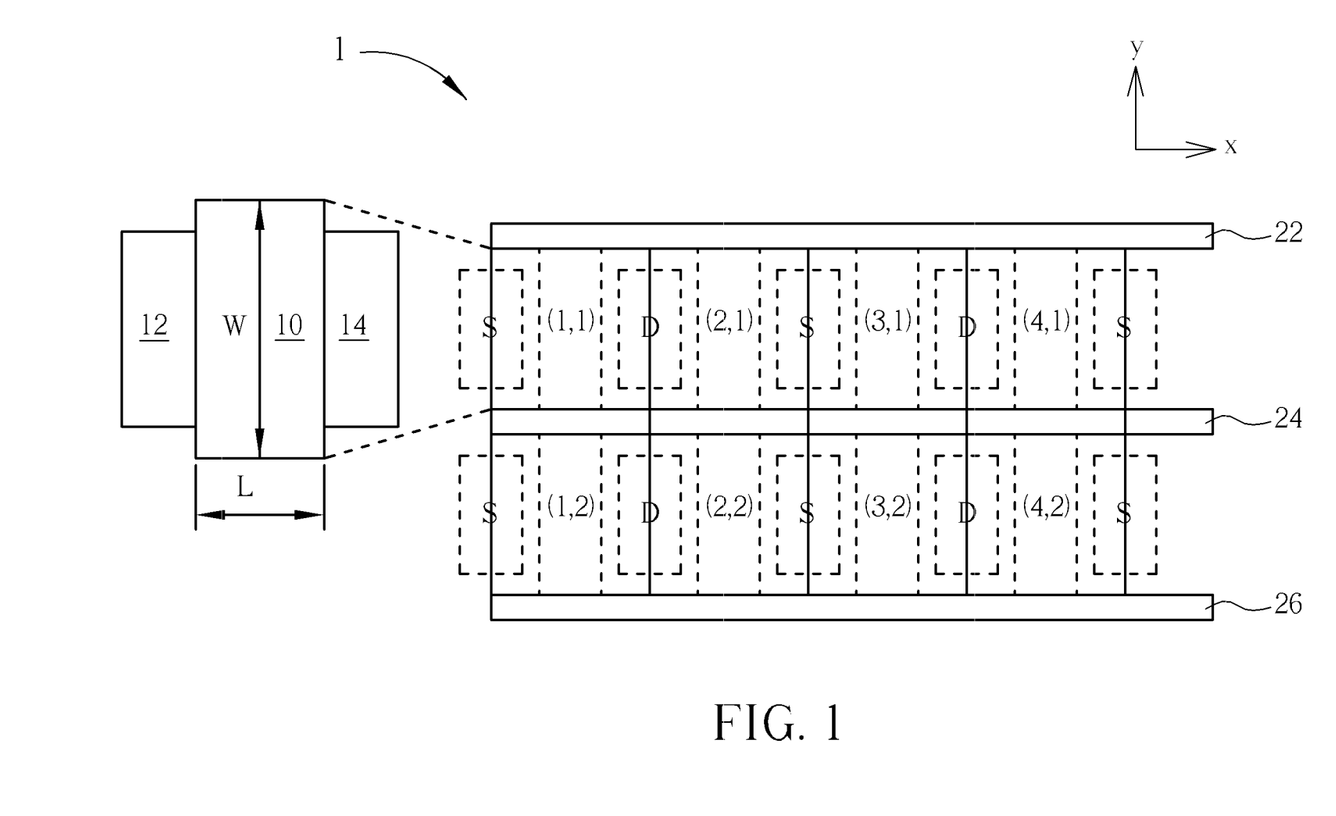
FIG. 1 is a plan view showing the layout of an exemplary mmW transistor device in accordance with one embodiment of this invention.
Figure 2:
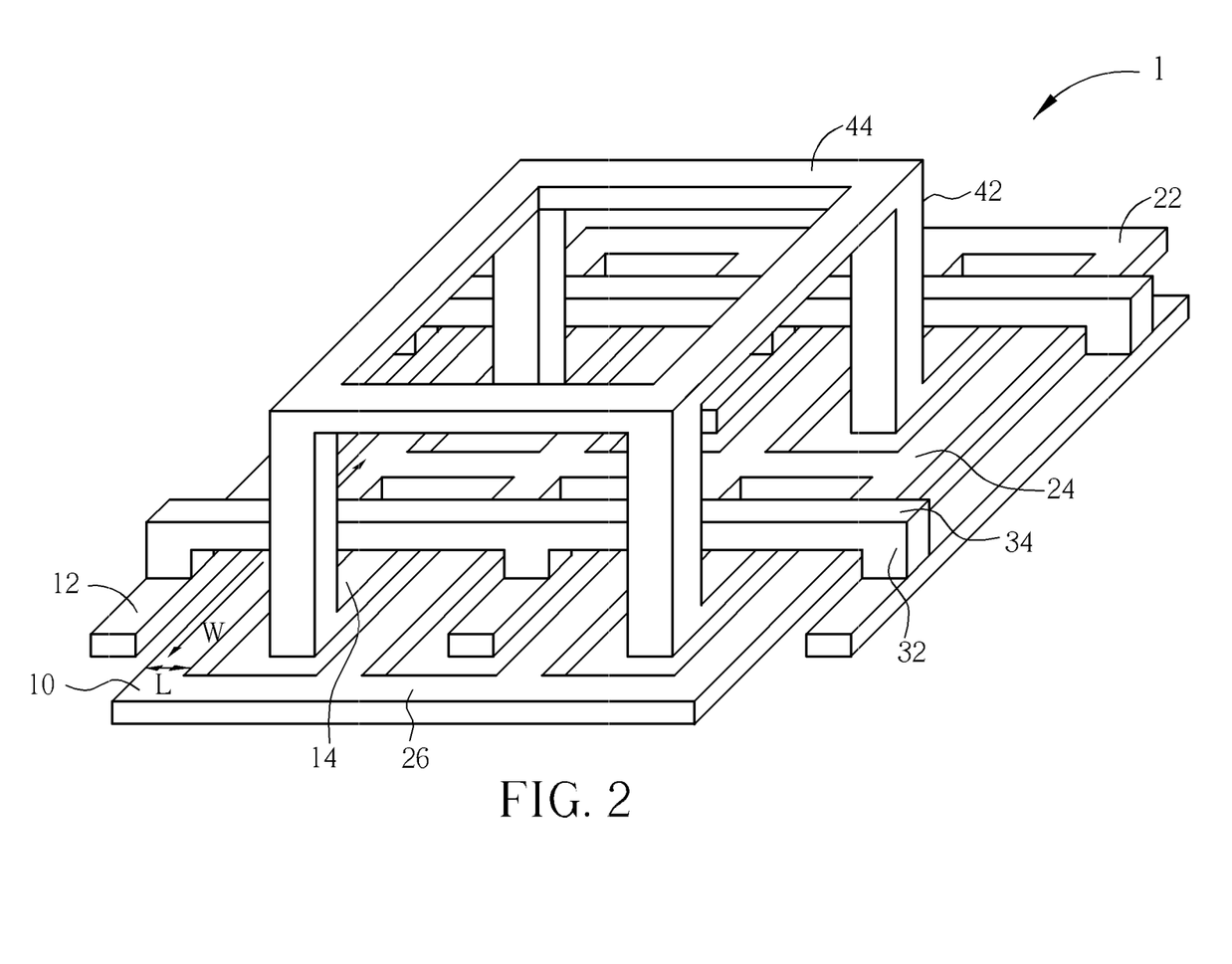
FIG. 2 is a three-dimensional diagram of the exemplary mmW transistor device of FIG. 1.

Please refer to FIG. 1 and FIG. 2. FIG. 1 is a plan view showing the layout of an exemplary mmW transistor device 1 in accordance with one embodiment of this invention. FIG. 2 is a three-dimensional diagram of the exemplary mmW transistor device 1 of FIG. 1. As shown in FIG. 1, the mmW transistor device 1 comprises a plurality of sub-cells which are arranged in matrix array and only eight of the sub-cells are shown and are denoted by addresses (1, 1), (2, 1), (3, 1), (4, 1), (1, 2), (2, 2), (3, 2), and (4, 2) respectively. For example, the sub-cell addressed by (1, 1) refers to that the sub-cell is located at the intersection of the first column and the first row of the matrix array, the address (1, 2) refers to that the sub-cell is located at the intersection of the first column and the second row of the matrix array, and so forth.

The exemplary dual-row layout depicted in FIG. 1 may be deemed as an improved layout compared to the prior art prototypal layout in which the eight sub-cells are arranged in one single row. According to one embodiment, a layout resistance of the improved layout is less than a layout resistance of a prototypal layout in which the fingers are arranged in a single row. According to another embodiment, a layout inductance of the improved layout is less than a layout inductance of a prototypal layout in which the fingers are arranged in a single row. According to still another embodiment, a wave reflection of the improved layout is less than a wave reflection of a prototypal layout in which the fingers are arranged in a single row. A resistance difference between an overall length and an overall width of the improved layout are less than that of the prototypal layout.

It is understood that the number of the sub-cell depends upon the desired size of the final transistor and is thus not limited to eight sub-cells. The layout of the mmW transistor device according to this invention has a substantially rectangular outline with a reduced overall aspect ratio (height-to-width ratio) of the final layout dimension. Ideally, the overall aspect ratio is equal to 1 or approximates to 1. Preferably, the overall aspect ratio of the layout of the mmW transistor device may range between 0.5 and 2. For example, the rectangular outline of the final layout of the mmW transistor device may have a final layout dimension of 15 μm*12 μm and therefore an overall aspect ratio of 1.25 (15/12=1.25).

By limiting the overall aspect ratio in the aforesaid pre-selected range, the undesired wave reflection at the discontinuity in the transmission line is mitigated and the layout resistance such as gate resistance $R_g$, source resistance $R_s$ and drain resistance $R_d$ is reduced. Hence, the efficiency of the device can be improved. The aforesaid wave reflection is determined by the characteristic impedance of the feed line connecting to the transistor, which typically ranges between 50 ohm and 75 ohm. In the foreseeable future, on chip transmission line width will be on the order of 5-15 μm in width and the present invention provides no discontinuity or negligible discontinuity when connecting devices. By limiting the overall aspect ratio in the aforesaid pre-selected range, a higher $f_T$ and $f_{MAX}$ for a given technology can be provided. The higher $f_T$ can provide lower noise figure and the higher $f_{MAX}$ can provide higher power gain. More advanced process provides higher intrinsic $f_T$ and $f_{MAX}$, but the wiring parasitic or coupling limits the improvement.

As shown on the left-hand side of FIG. 1, each of the sub-cells (1, 1), (2, 1), (3, 1), (4, 1), (1,2), (2, 2), (3, 2), and (4, 2) comprises a longitudinal gate finger 10 that elongates along the reference y-axis, a source doping region 12 disposed at one side of the longitudinal gate finger 10 and a drain doping region 14 at the other side of the longitudinal gate finger 10 opposite to the source doping region 12. The longitudinal gate finger 10 has a gate length L in a first direction parallel with the reference x-axis and a gate width W in the second direction parallel with the reference y-axis. The device size can be defined as N*W/L. More specifically, the improved layout of FIG. 1 comprises two parts each sized as N*W/L*M, where N/M is an integer smaller than N, and M is the number of rows of the gate fingers arranged in the layout, for example, in this example, M=2.

As best seen in FIG. 1, the source doping region 12 or the drain doping region 14 may be commonly used by two neighboring sub-cells on the same row. For example, the sub-cells (1, 1) and (2, 1) commonly uses the same one drain doping region and the sub-cells (2, 1) and (3, 1) commonly uses the same one source doping region. For the sake of clarity, the longitudinal gate finger 10, the source doping region 12 and the drain doping region 14 in the matrix array are indicated by dotted lines.

The mmW transistor device 1 further comprises a plurality of parallel connecting bars 22, 24 and 26 extending along the first direction that is parallel with the reference x-axis, such that the source doping region 12 and the drain doping region 14 are enclosed by the longitudinal gate finger 10 and the respective connecting bars 22, 24 and 26. According to this embodiment, the plurality of connecting bars 22, 24 and 26 are polysilicon bars and are defined concurrently with the longitudinal gate fingers 10.

The plurality of connecting bars 22, 24 and 26 electrically connects with the respective distal ends of the longitudinal gate finger 10 of each of the sub-cells (1, 1), (2, 1), (3, 1), (4, 1), (1, 2), (2, 2), (3, 2), and (4, 2). According to this embodiment of the invention, the mmW transistor device 1 comprises at least n connecting bars, wherein n≥3. Contacts (not shown) are formed on the connecting bars 22, 24 and 26 to provide a double side gate contact configuration, which reduces $R_g$.

As best seen in FIG. 2, the source doping regions 12 of the sub-cells (1, 1), (2, 1), (3, 1), (4, 1), (1, 2), (2, 2), (3, 2), and (4, 2) are interconnected to each other through via structures 32 and metal trace 34, while the drain doping regions 14 of the sub-cells (1, 1), (2, 1), (3, 1), (4, 1), (1, 2), (2, 2), (3, 2), and (4, 2) are interconnected to each other through via structures 42 and a ring-shaped metal trace 44. The metal trace 34 and the ring-shaped metal trace 44 are formed in different level of the metal interconnection. It is another germane feature of this invention that the double source/drain pitch reduces high field mobility degradation, thereby improving $f_T$ and $f_{max}$.

Figure 3:
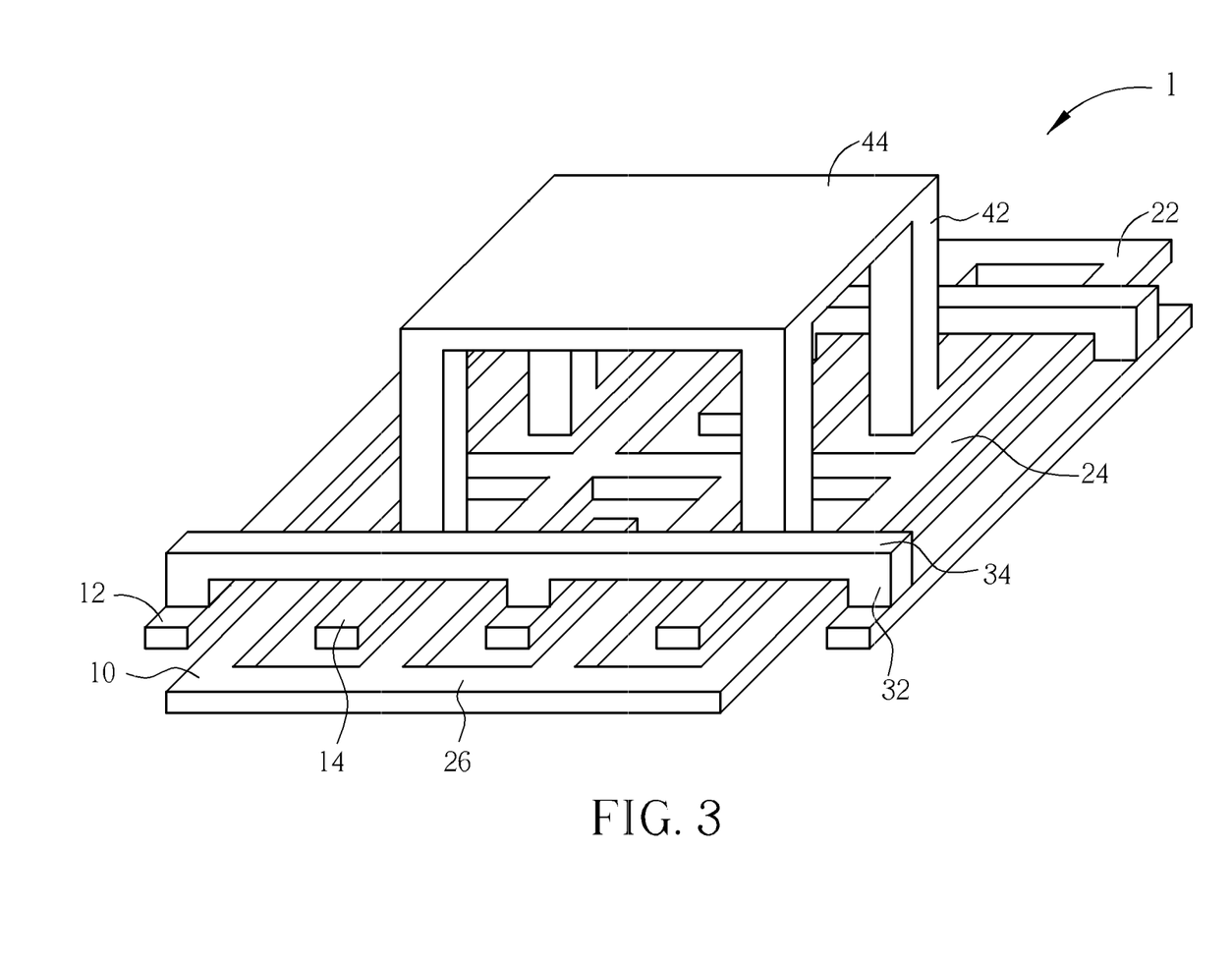
FIG. 3 is a three-dimensional diagram of the mmW transistor device in accordance with another embodiment of this invention.

FIG. 3 is a three-dimensional diagram of the mmW transistor device 1a in accordance with another embodiment of this invention, wherein like numeral numbers designate like elements, regions or layers. As shown in FIG. 3, the differences between the mmW transistor device 1a of FIG. 3 and the mmW transistor device 1 of FIG. 2 include that the layout of the mmW transistor device 1a of FIG. 3 is symmetric with respect to the connecting bar 24 and that the drain doping regions 14 of the sub-cells are interconnected to each other through via structures 42 and a metal plate 46.

Figure 4:
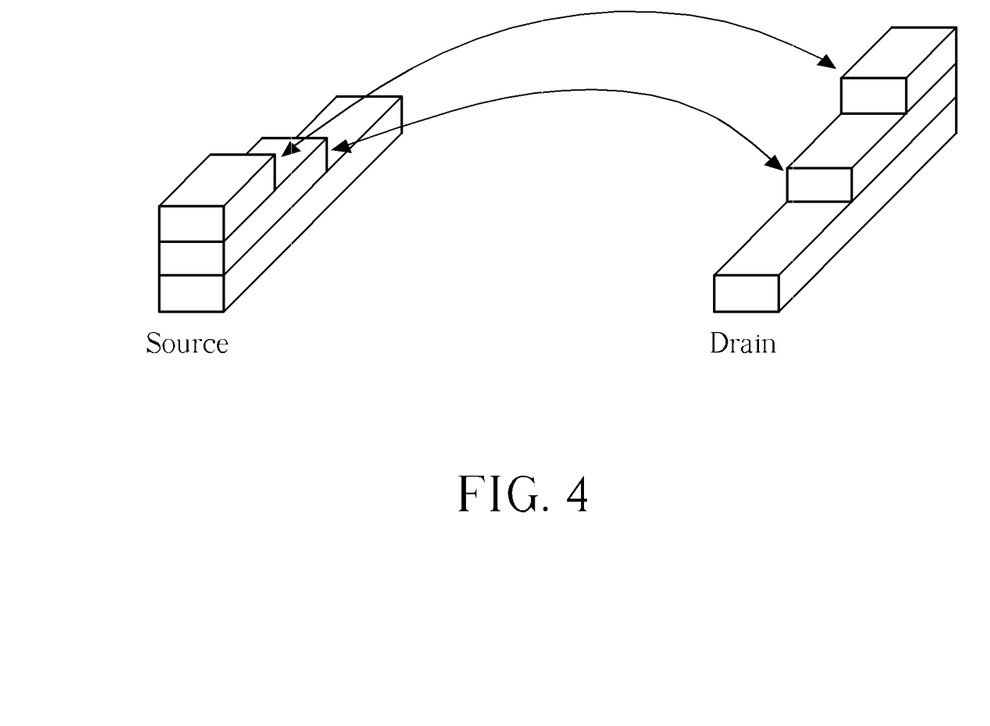
FIG. 4 is a schematic diagram showing the staircase-shaped source/drain contact structure according to this invention.

FIG. 4 is a schematic diagram showing the staircase-shaped source/drain contact structure according to this invention. For the sake of clarity, the gate pattern is not shown. As shown in FIG. 4, the staircase-shaped source/drain contact structure reduces parasitic capacitance between the source and the drain ($C_{ds}$) because of less metal line coupling in the same layer or plane.

In one aspect, the present invention provides a transistor device having drain, gate and source, characterized in that: at least one of the drain, gate and source comprising N fingers, wherein the fingers of the at least one of the drain, gate and source are connected to form an improved layout such that a layout resistance of the improved layout is less than a layout resistance of a prototypal layout in which the fingers are arranged in a single row.

Both device sizes of the prototypal layout and the improved layout are N*W/L, where W is a width of each of the fingers, and L is a length of each of the fingers. The improved layout comprises a plurality of parts each sized as N*W/M*L, where N/M is an integer smaller than N.

Figure 5:
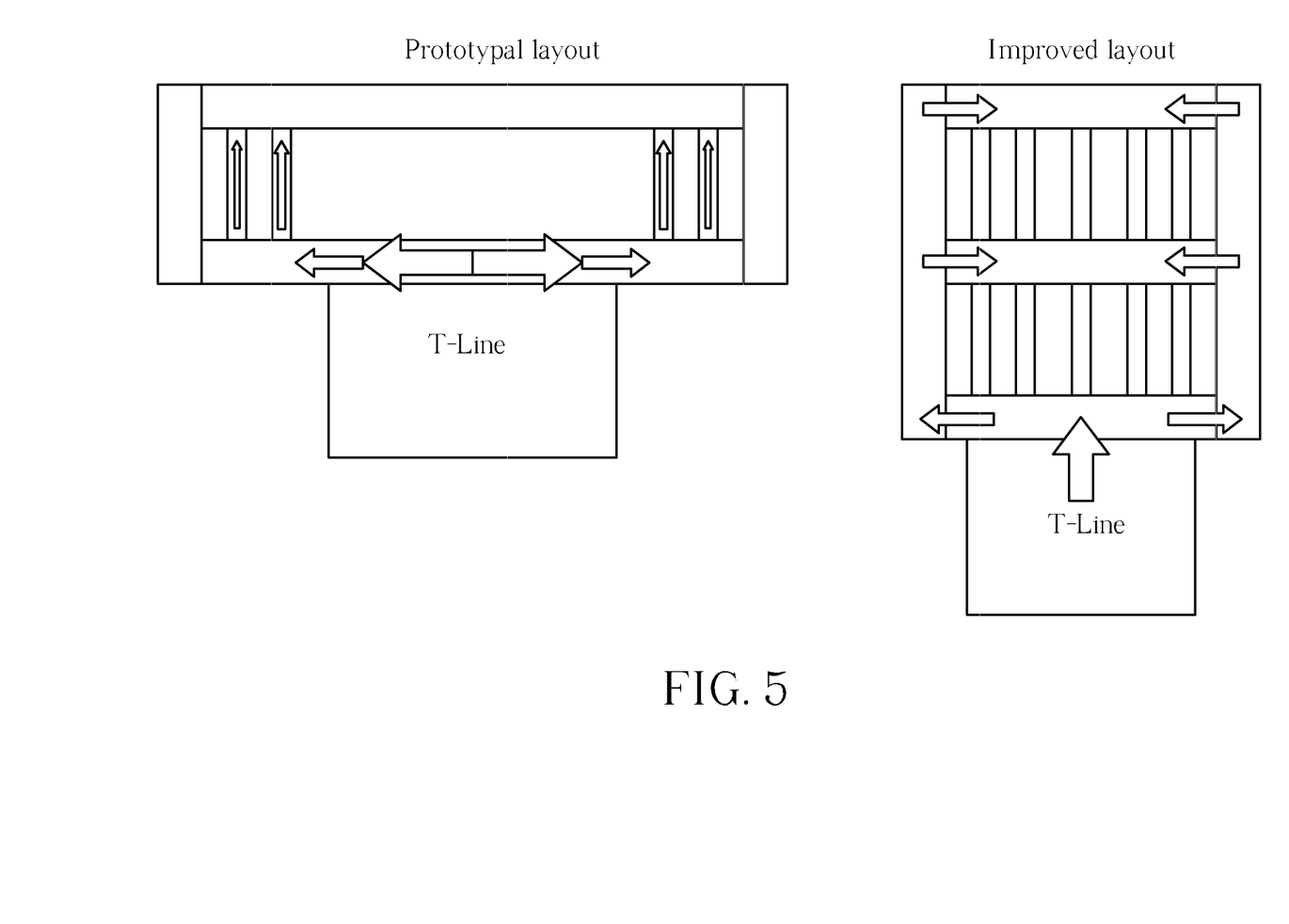
FIG. 5 demonstrates the improvements of the invention using power amplifier (PA) drain resistance as an example.

The aforesaid improvements are demonstrated in FIG. 5 using power amplifier (PA) drain resistance as an example. As shown in FIG. 5, the prototypal layout on the left-hand side has multiple drain fingers arranged in one single row. Since the overall aspect ratio is large, severe discontinuity reflection occurs at the interface between the prototypal layout and the transmission line (T-line) and the outside fingers located at two distal ends of the prototypal layout are not effective. Compared to the prototypal layout on the left-hand side, the improved layout on the right-hand side has minimized wave discontinuity and wave reflection at the signal inlet or interface between the T-line and the device layout. Further, the non-effectiveness of the outer fingers and IR drop can be improved.

The transistor device layout as described can be used to further incorporate other techniques such as double side gate contact to reduce $R_g$, double source/drain pitch to reduce high field mobility degradation and to improve $f_T$ and $f_{MAX}$, or staircase source/drain metals to reduce $C_{gs}$, $C_{gd}$ and $C_{ds}$.

Figure 6:
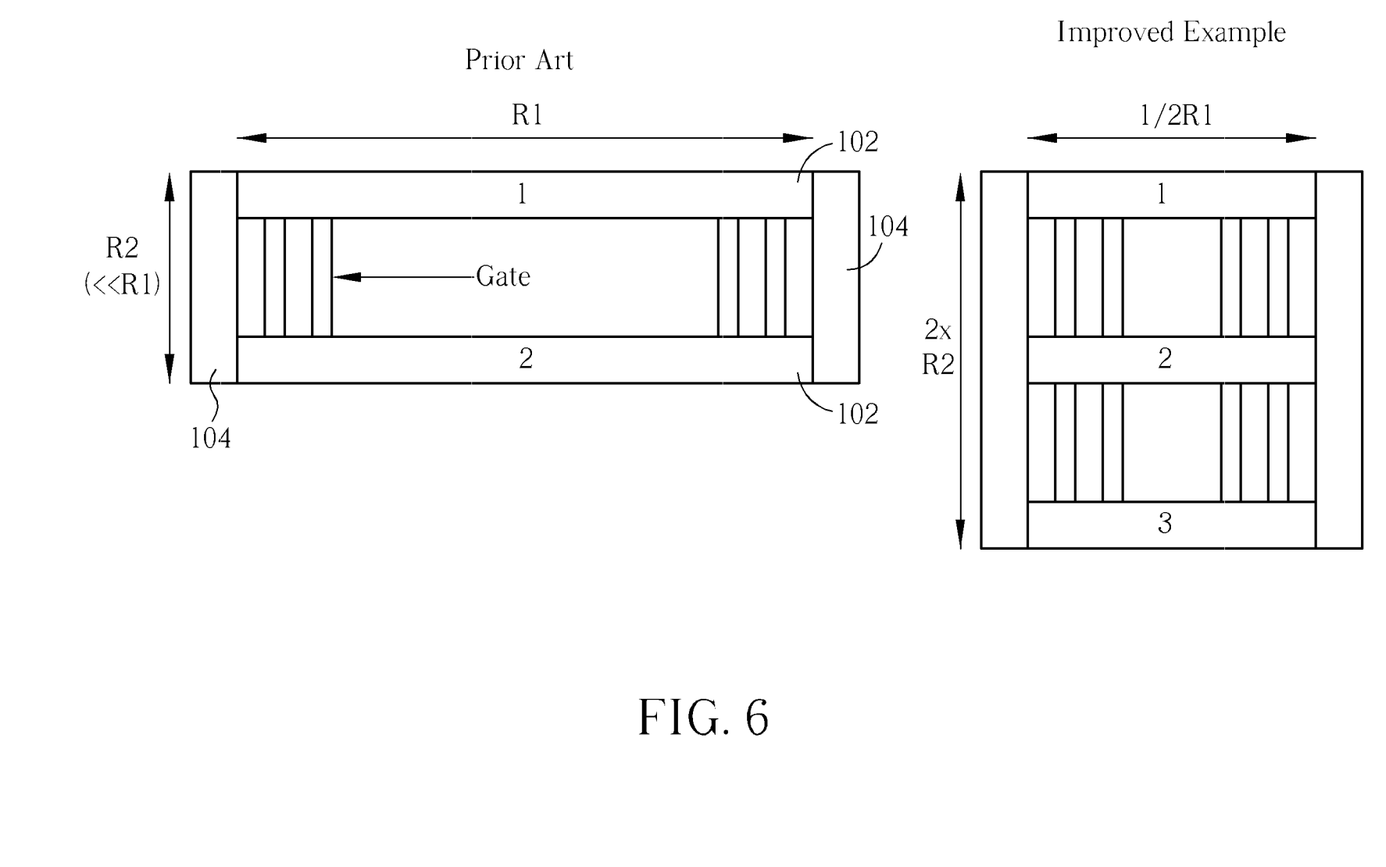
FIG. 6 demonstrates an advantage of the invention.

FIG. 6 demonstrates an advantage of the invention. Taking the gate resistance as an example, typically R2 of the vertical end connecting bars 104 is much smaller than R1 of the two horizontal connecting bars 102 due to multiple metal layer and wider metal line. According to the prior art, R1 cannot be easily reduced by multiple metal or wide metal because of the limitation by parasitic gate cap and physical gate contact size. The improved three-row layout with the same device size on the right-hand side has reduced gate resistance, which may be less than one sixth of the original resistance of the prior art device layout on the left-hand side of FIG. 6.

Figure 7A:
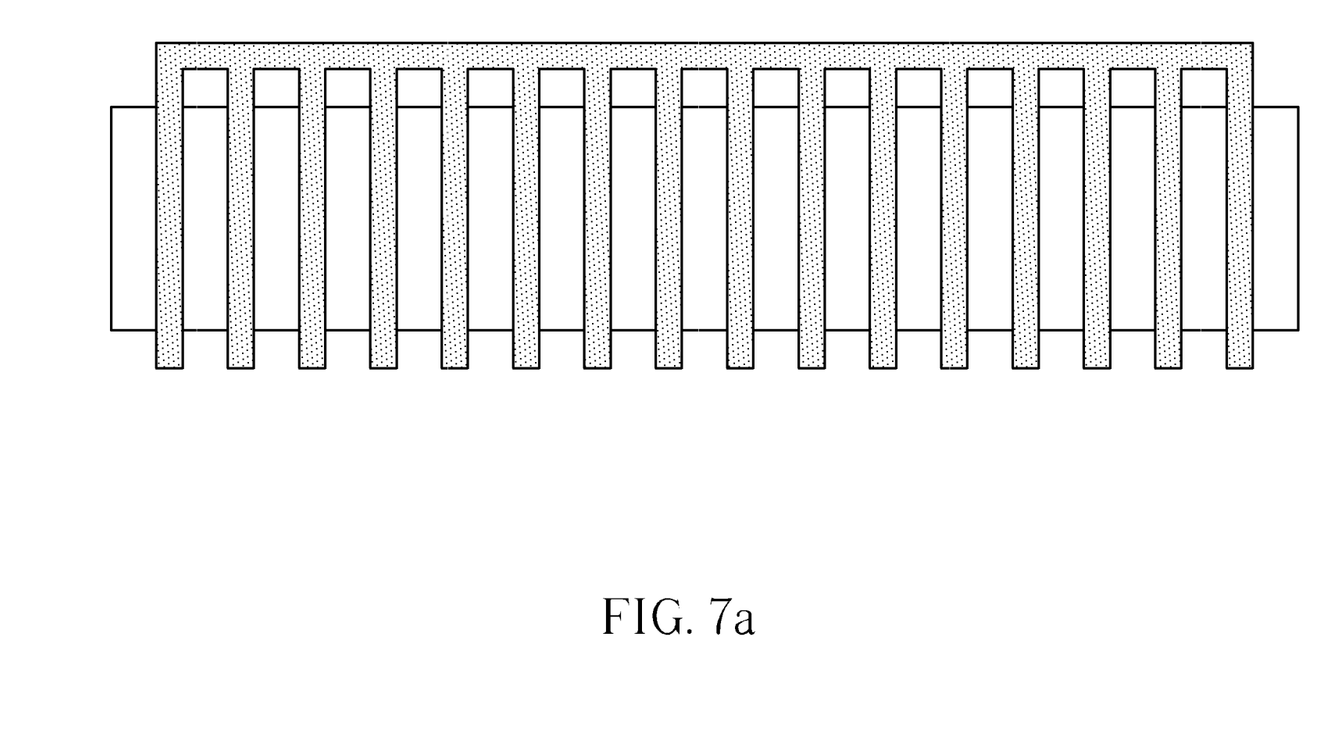
FIGS. 7a-7c are exemplary transistor device layouts having the same number of sub-cells in respective layouts for demonstrating the relationship between the overall aspect ratio of each layout and the layout resistance ($R_g$).
Figure 7B:
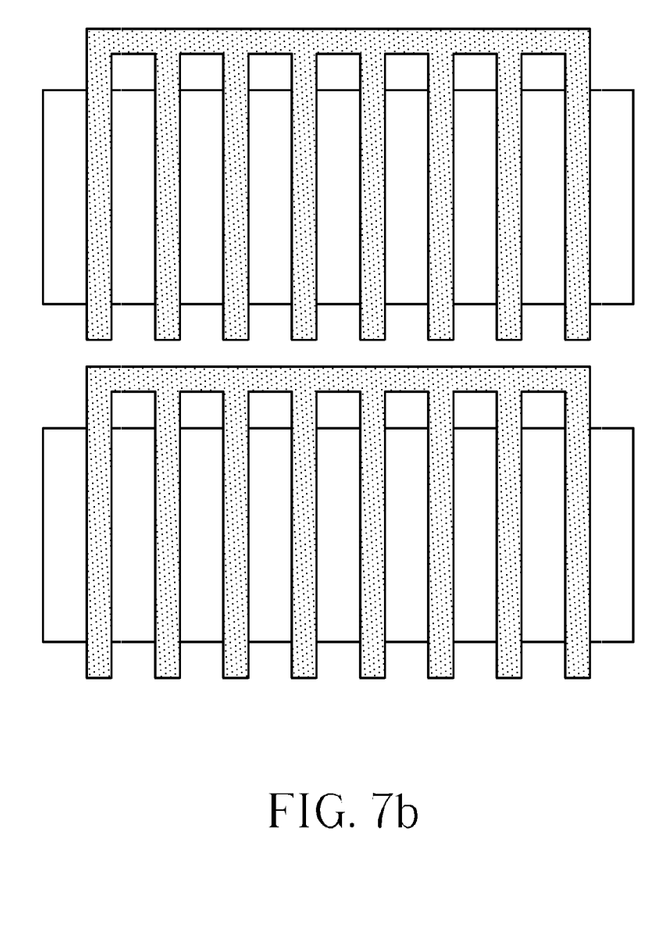
Figure 7C:
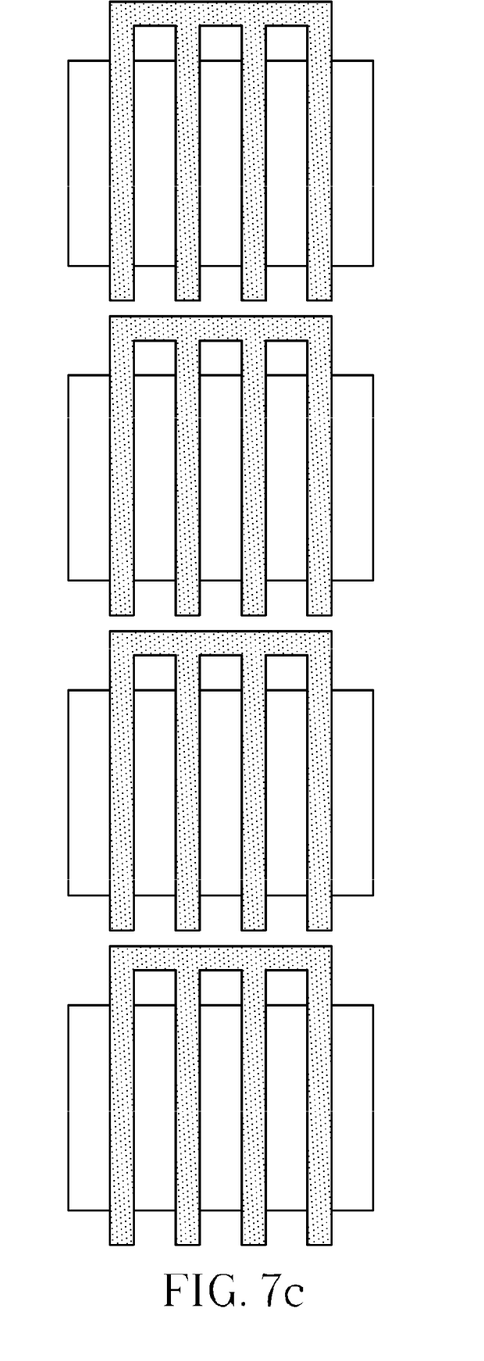

FIGS. 7a-7c are exemplary transistor device layouts having the same number of sub-cells, e.g., the same number of gate fingers, in respective layouts for demonstrating the relationship between the overall aspect ratio of each layout and the layout resistance ($R_g$), wherein FIG. 7a demonstrates a single-row layout with sixteen gate fingers, FIG. 7b demonstrates a dual-row layout with eight gate fingers in each row, while FIG. 7c demonstrates a four-row layout with four gate fingers in each row.

Figure 8:
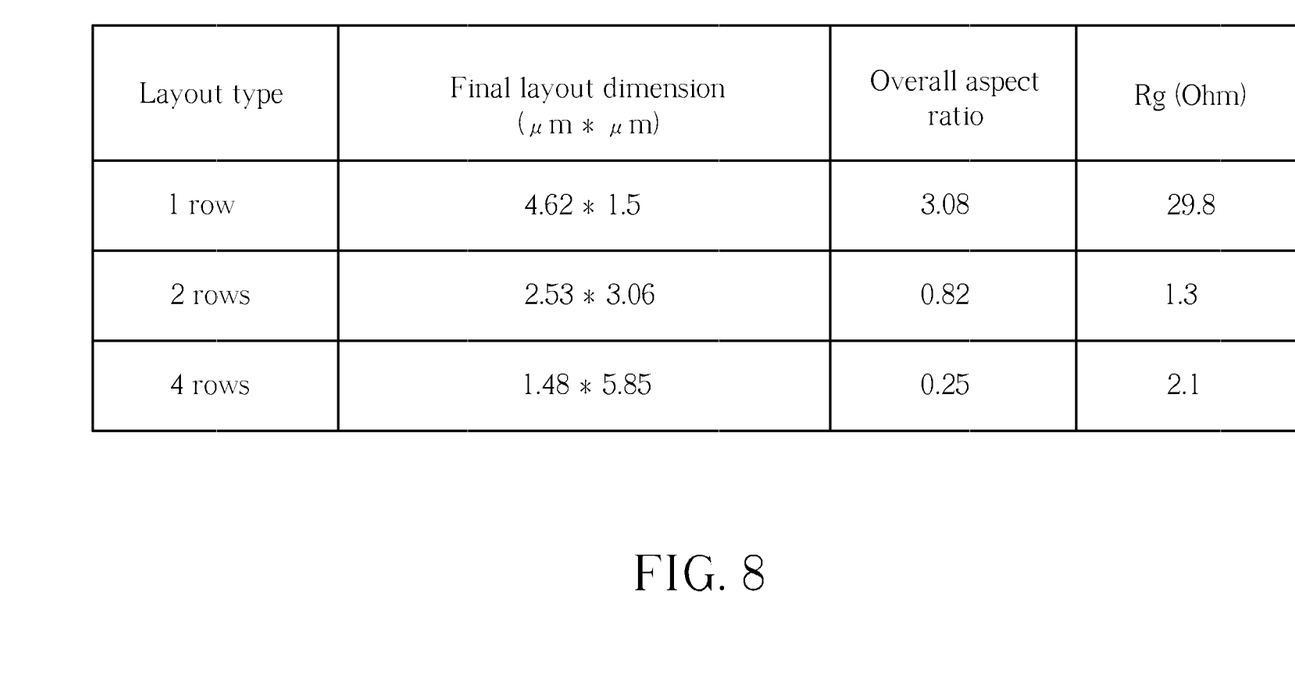
FIG. 8 demonstrates the exemplary final layout dimension of each layout type of FIGS. 7a-7c and the corresponding overall aspect ratio and $R_g$.

The exemplary final layout dimension of each layout type and the corresponding overall aspect ratio and $R_g$ are shown in FIG. 8. The three transistor device layouts as depicted in FIGS. 7a-7c have the same device size of N*W/L, for example, W=2.0 μm, L=0.065 μm and N=16. Assuming that the gate fingers in all of the three transistor device layouts are interconnected by a metal layer (not shown), it can be seen that the second layout type (dual-row layout) that has an outline substantially analogous to a square shape has the smallest layout resistance $R_g$ while its overall aspect ratio is 0.82.

Those skilled in the art will readily observe that numerous modifications and alterations of the device and method may be made while retaining the teachings of the invention.

What is claimed is:

1. A transistor device having drain, gate and source, characterized in that:
the gate comprises N fingers elongating along a first direction, wherein the N fingers of the gate are connected together and the N fingers are arranged in at least two rows along a second direction, wherein the first direction is perpendicular to the second direction, wherein the transistor device has a device size of N*W/L, where N is an integer, W is a width of each of the fingers, and L is a length of each of the fingers.

2. The transistor device as claimed in claim 1, wherein the transistor device comprises a layout comprising a plurality of parts each sized as N*W/M*L, where N/M is an integer smaller than N.

3. The transistor device as claimed in claim 2, wherein an overall aspect ratio of the layout ranges between 0.5 and 2.

4. The transistor device as claimed in claim 1, being utilized in a millimeter-wave application.

5. A transistor device having drain, gate and source, characterized in that:
the drain comprises N fingers elongating along a first direction, wherein the N fingers of the drain are connected together and the N fingers are arranged in at least two rows along a second direction, wherein the first direction is perpendicular to the second direction, wherein the transistor device has a device size of N*W/L, where N is an integer, W is a width of each of the fingers, and L is a length of each of the fingers.

6. The transistor device as claimed in claim 5, wherein the transistor device comprises a layout comprising a plurality of parts each sized as N*W/M*L, where N/M is an integer smaller than N.

7. The transistor device as claimed in claim 6, wherein an overall aspect ratio of the layout ranges between 0.5 and 2.

8. A transistor device having drain, gate and source, characterized in that:
the source comprises N fingers elongating along a first direction, wherein the N fingers of the source are connected together and the N fingers are arranged in at least two rows along a second direction, wherein the first direction is perpendicular to the second direction, wherein the transistor device has a device size of N*W/L, where N is an integer, W is a width of each of the fingers, and L is a length of each of the fingers.

9. The transistor device as claimed in claim 8, wherein the transistor device comprises a layout comprising a plurality of parts each sized as N*W/M*L, where N/M is an integer smaller than N.

10. The transistor device as claimed in claim 9, wherein an overall aspect ratio of the layout ranges between 0.5 and 2.

11. A millimeter-wave transistor device, comprising:
a plurality of sub-cells arranged in matrix array, each of the sub-cells comprising a longitudinal gate finger elongating along a first direction, a source doping region disposed at one side of the longitudinal gate finger and a drain doping region at the other side of the longitudinal gate finger opposite to the source doping region; and
parallel connecting bars extending along a second direction, electrically connecting with both distal ends of the longitudinal gate finger of each of the sub-cells, wherein the first direction is substantially perpendicular to the second direction.

12. The millimeter-wave transistor device according to claim 11 wherein the plurality of sub-cells arranged in matrix array has a substantially rectangular outline.

13. The millimeter-wave transistor device according to claim 12 wherein the substantially rectangular outline has an overall aspect ratio ranging between 0.5 and 2.

14. The millimeter-wave transistor device according to claim 11 wherein the parallel connecting bars are polysilicon bars.

15. The millimeter-wave transistor device according to claim 11 wherein the source doping region is enclosed by the parallel connecting bars and the longitudinal gate finger.

16. The millimeter-wave transistor device according to claim 11 wherein the drain doping region is enclosed by the parallel connecting bars and the longitudinal gate finger.

17. The millimeter-wave transistor device according to claim 11 wherein the source doping region or the drain doping region is commonly used by two neighboring said sub-cells on the same row.

18. The millimeter-wave transistor device according to claim 11 wherein contact formed on the source doping region or the drain doping region has a staircase shape in order to reduce parasitic capacitance between the source and the drain.

19. A transistor device layout, comprising:
a gate pattern comprising a plurality of vertical gate fingers and a plurality of horizontal connecting bars connected to both distal ends of each of the vertical gate fingers so as to define a plurality of enclosed source areas and drain areas within the gate pattern;
a plurality of source doping regions disposed in the source areas;
a plurality of drain doping regions disposed in the drain areas; and
a transmission line coupled to an end connecting bar of the plurality of horizontal connecting bars.

20. The transistor device layout according to claim 19 wherein the vertical gate fingers are arranged in at least two rows.

21. The transistor device layout according to claim 19 wherein the gate pattern has a substantially rectangular outline.

22. The transistor device layout according to claim 21 wherein the substantially rectangular outline has an overall aspect ratio ranging between 0.5 and 2 to thereby mitigate wave reflection at discontinuity in the transmission line.

23. The transistor device layout according to claim 19 further comprising two vertical end connecting bars that connect to the horizontal connecting bars.

24. The transistor device layout according to claim 19 further comprising an asymmetric stair-shaped source/drain contact structure.

\* \* \* \* \*